United States Patent [19]
Murray

[11] Patent Number: 6,111,660
[45] Date of Patent: Aug. 29, 2000

[54] EFFICIENT DIGITAL DATA ENCODING IN A DATA PROCESSING SYSTEM

[75] Inventor: Eric Murray, Los Gatos, Calif.

[73] Assignee: N*Able Technologies, Inc., Cupertino, Calif.

[21] Appl. No.: 09/164,183

[22] Filed: Sep. 30, 1998

[51] Int. Cl.[7] .................................................. G06F 17/30
[52] U.S. Cl. ............................................ 358/433; 707/101
[58] Field of Search ................... 707/1, 5, 10, 100–104, 707/200–206; 358/261.1, 261.2, 433; 341/50, 87, 95

[56] References Cited

U.S. PATENT DOCUMENTS

| | | | |
|---|---|---|---|
| 5,511,054 | 4/1996 | Oishi et al. | 369/59 |
| 5,608,396 | 3/1997 | Cheng et al. | 341/50 |
| 5,805,303 | 9/1998 | Imaizumi et al. | 358/433 |

Primary Examiner—Ruay Lian Ho
Attorney, Agent, or Firm—Sawyer Law Group LLP

[57] ABSTRACT

An improved method for encoding digital-data in a data processing system providing a buffer and utilizing a forward looking encoding process is disclosed. The forward looking encoding process includes the sequential steps of allocating a maximum number of bytes for a maximum size data-length field within the buffer and determining a data-length value for the digital data by encoding each of at least one portion of the digital data, the maximum size data-length field for receiving the data-length value. The forward looking encoding process also includes adjusting the maximum size data-length field, wherein the forward looking encoding process avoids a memory consuming duplication of the digital data.

26 Claims, 6 Drawing Sheets

EFFICIENT DIGITAL DATA ENCODING IN A DATA PROCESSING SYSTEM

FIELD OF THE INVENTION

The present invention relates to electronic transactions in a computer system and more particularly to efficiently encoding digital data for the electronic transactions in the computer system.

BACKGROUND OF THE INVENTION

Computer networks have emerged as a principal medium for conducting electronic commerce and other types of electronic transactions. As such, computer networks include various technologies to implement electronic transactions and messages exchange applications.

For example, messages encoding and decoding and digital certificates technologies have emerged and are commonly used to provide for secure electronic transactions. Digital certificates are commonly used in digital data processing applications, including multi-party electronic transactions, as a mechanism for providing and verifying identity of entities which use them. Entities use their given identities in communicating with each other when participating in electronic transactions, including electronic commerce. Digital certificates technology is implemented as an authentication technique.

As an example of digital data encoding, transaction messages (messages) encoding is provided through electronic transaction protocols which utilize message construction methods. Typically, these methods are transparent to the operating environment and allow encoding of messages to occur uniformly without regard to the type of operating system within a particular computer system. One such method for encoding digital data is known as Tag-Length-Value (TLV) encoding.

Many TLV encoding schemes allow for digital data, including multiple elements (hereafter collectively referred to as elements), with variable-sized data-length fields. That is, the fields indicating the length of corresponding data in elements vary in size (number of bytes) based upon the length of these messages. Some encoding rules require, for example, that for elements of 128 bytes or more their corresponding data-length fields be 2 bytes long, and for elements of 256 bytes or more, their corresponding data-length fields be 3 bytes long.

Typically, encoding rules do not allow the data-length fields to include 'null' bytes. Namely, the data-length fields may not includes bytes beyond those that are required for accommodating the respective elements data length value. However, the number of bytes required for the data-length field is not known in advance before the corresponding messages are constructed since their length is unknown ahead of time. Therefore, conventional TLV data encoding methods typically engage in a step by step resource-consuming construction for encoding the elements whereby in each stage the length of the data field is obtained.

One message encoding method is a memory consuming construction in that it requires utilizing temporary buffers for as many bytes as are contained in the data field of each element. The temporary buffers duplicate the data fields of messages while obtaining their length. For complex messages which have, for example, nested TLV elements several levels deep, the process is complex and the amount of memory consumed in creating the temporary buffers is significant.

Another encoding method is a compute intensive construction in that it involves traversing backwards through the many levels of the elements for determining the total length thereof. This method is also memory consuming as it also requires the use of temporary buffers for constructing the message tree, i.e. constructing the message beginning from the bottom layer and concluding at the top layer.

Data processing systems, particularly embedded systems, have limited amounts of memory available. Therefore, there is a need for efficient message encoding. This message encoding needs to consume less resources, particularly memory. Moreover, an efficient digital data encoding in a data processing system need to be easily implemented. These needs are addresses by the present invention as set forth herein below.

SUMMARY OF THE INVENTION

To the accomplishment of the foregoing and related objectives, the present invention is directed toward efficient digital data encoding in a data processing system. In one aspect of the present invention, a method for the efficient digital data encoding in a data processing system includes providing a buffer and utilizing a forward looking encoding process. The forward looking encoding process includes the sequential steps of allocating a maximum number of bytes for a maximum size data-length field within the buffer and determining a data-length value for the digital data by encoding each of at least one portion of the digital data, the maximum size data-length field for receiving the data-length value. The forward looking encoding process also includes adjusting the maximum size data-length field, wherein the forward looking encoding process avoids a memory consuming duplication of the digital data.

In another aspect of the present invention, a method and a computer readable medium including instructions (collectively referred to as "the method"), for the efficient digital data encoding includes providing a buffer having a type field, a data-length field and a data field. The method also includes tagging the digital data in the type field to identify the type of the digital data, allocating a predetermined number of bytes in the buffer for the data-length field of the buffer, the data-length field for receiving a digital data length value. The method further includes determining the digital data length value based on the length of the digital data, appending the digital data proximate to a header in the buffer, the header including the type and data-length fields, and writing the digital data length value in the data-length field. The method additionally includes shifting the digital data in the buffer to eliminate null bytes in the data-length field.

In yet another aspect of the present invention, a data processing system for the efficient digital data encoding includes a memory including a buffer. The data processing system further including means communicating with the buffer for tagging the digital data to identify the type of the digital data, means communicating with the buffer for allocating a predetermined number of bytes from the buffer for a data-length field, the data-length field for receiving a digital data length value. The data processing system also includes means communicating with the buffer for appending the digital data to the data-length field, means communicating with the appending means for determining the digital data length value based on the length of the digital data, means communicating with the buffer and the determining means for writing the digital data length value in the data-length field, and means communicating with the buffer for shifting the digital data in the buffer to eliminate null bytes in the data-length field.

DETAILED DESCRIPTION OF THE INVENTION

The present invention relates to efficiently encoding digital data.

The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
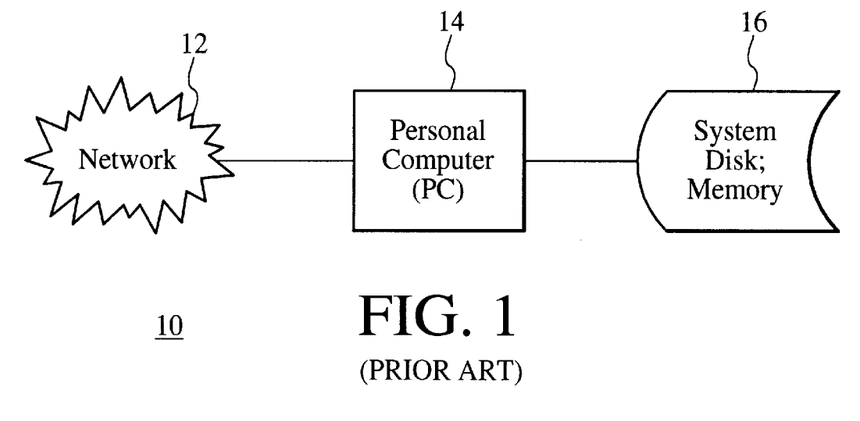
FIG. 1 is a block diagram of a conventional system for performing electronic transactions.

Transactions conducted in a data processing system are commonly referred to as electronic transactions. Electronic transactions are typically conducted over a computer network through which data processing systems communicate with each other. FIG. 1 is a block diagram of a conventional data processing system 10 for performing electronic transactions.

As illustrated in FIG. 1, the system 10 includes a personal computer or workstation (computer) 14 which is equipped with a computer disk and memory (disk) 16. The computer 14 is linked to other computers (not shown) through the network 12. The network 12 can be a local area network linking computers in one building, a wide area network linking computers of one organization located in separate buildings, a public network such as the Internet, etc.

Conventional computer networks are a principal medium for conducting electronic commerce and other types of electronic transactions and messages exchanges. To that end, message data encoding techniques are utilized. Message data encoding is provided through protocols which utilize message construction methods. Typically, these methods are transparent to the operating environment and allow encoding of messages to occur uniformly without regard to the type of operating system within a particular computer system. One such method is known as type-length-value (TLV) message encoding. Each message data, or data of a message portion when the message includes nested messages, is tagged with the type field for identifying it and is further associated with a variable-sized data-length field. However, conventional TLV message encoding techniques are typically inefficient in that they consume substantial resources and computing time.

One message encoding method is a memory consuming construction in that it requires utilizing temporary buffers for as many bytes as are contained in the data field of the messages. The temporary buffers duplicate the data fields of messages while obtaining their length. For complex messages which have, for example, nested messages several levels deep, the process is complex and the amount of memory consumed in creating the temporary buffers is significant.

Another message encoding method is a compute intensive construction in that it involves traversing backwards through the many levels of the messages for determining the total length thereof. This method is also memory consuming as it also requires the use of temporary buffers for constructing the message tree, namely, constructing the message beginning from the bottom layer and concluding at the top layer.

Data processing systems, particularly embedded systems, have limited amounts of memory available. Therefore, there is a need for providing efficient digital data encoding including message TLV encoding.

To the accomplishment of the foregoing and related ends, the present invention, as hereafter fully described, provides efficient encoding of digital data in a data processing system in that it advantageously avoids excessive consumption of processor cycles and system resources. In particular, the present invention utilizes a forward looking message TLV encoding process in that it allocates in advance a maximum number of bytes for the data-length field and then determines the data-length as it proceeds to append the various portions of the message. The present invention then adjusts the data-length field after the total and final length of the message is known. This approach uses a single message buffer, rather than duplicates, and at most it allocates an excess of only a few bytes for the maximum size data-length field.

In the preferred embodiment, the present invention as described herein is directed to message TLV encoding in electronic transactions. However, it should be understood that the principles described herein apply to other technologies implementing TLV encoding including, for example, cryptography, gene sequencing etc. without departing from the scope and spirit of the present invention.

Electronic transactions messages are very complicated and use complex grammar rules which are typically governed by well known standards. Abstract syntax notation one (ASN.1) is one such standard. ASN.1 is a standard constituting internetworking grammar with rules and symbols that is used to describe and define protocols and programming languages.

Open systems interconnect (OSI) is a framework of standards for communication between distinct systems. The OSI standards provide a design model, the OSI model, in which groups of protocols or communication rules are organized in layers. Each layer performs a specific data communication function, wherein the functions are linked to each other by interdependency. For example, the OSI model includes layers associated with functions such as data transmission and routing, dialog management, transparency of communications and user applications.

ASN.1 is the OSI standard language for describing data types. The ASN.1 is an overall language standard encompassing a number of encoding rules with basic encoding rules (BER) and distinguishing encoding rules (DER) being the most common groups.

ASN.1 encoding rules require in general the use of a 1-byte data-length field to represent less than 128 bytes of data, a 2-bytes data-length field to represent 128 bytes or more of data, a 3-byte data-length field to represent 256 bytes or more of data, etc. These encoding rules do not allow data-length fields to include >null=bytes. Namely, data-length fields must include a least number of bytes which is sufficient to represent the length of the corresponding data fields.

Figure 2:
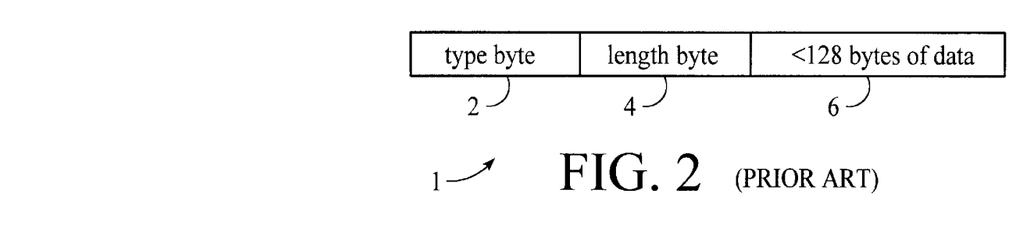
FIG. 2 illustrates an ASN.1 encoding of less than 128 bytes of data.

FIG. 2 illustrates an ASN.1 encoding of less than 128 bytes of data. The type field 2 identifies the type of the message 1. Since the message data field 6 includes less than 128 bytes, the data-length field 4 is a 1-byte field.

Figure 3:
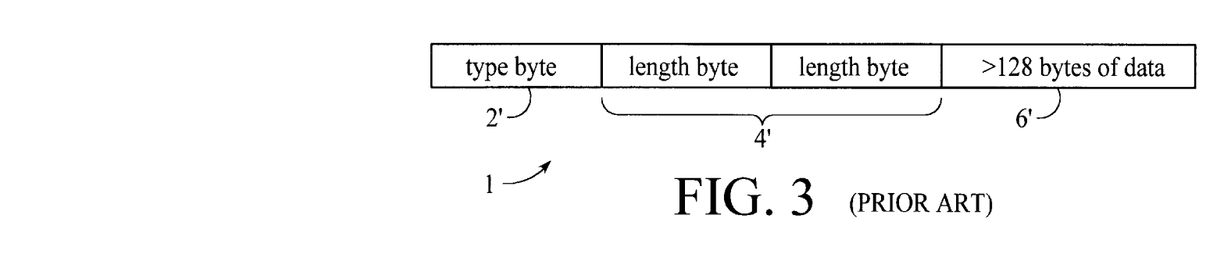
FIG. 3 illustrates an ASN.1 encoding of 128 bytes or more of data.

FIG. 3 illustrates an ASN.1 encoding of 128 bytes or more of data. The fields are similarly designated as in FIG. 2. The type field 2 identifies the type of the message 1. Since the message data field 6 includes 128 bytes or more, the data-length field 4 is a 2-bytes field.

As before mentioned, TLV encoding handles complex messages which may include an aggregate of nested elements of various data types. Each of the nested elements may itself be a complex element including an aggregate of nested elements of various data types. For example, an element can be defined by the following object type definition:

```
ExampleObject : : = SEQUENCE
  {
  name PrintableString,
  quantity INTEGER
  }
```

SEQUENCE is an ordered aggregation of one or more nested elements and has its own ASN.1 TLV encoding including type and data-length fields. Its length is the total length of all the nested data elements, including their TLV encoding fields. PrintableString is an object of variable length. Hence, in ASN.1 encoding the data-length field of name includes 1 byte for less than 128 bytes of data, 2 bytes for 128 or more bytes of data, 3 bytes for 256 or more bytes of data etc.

Figure 4:
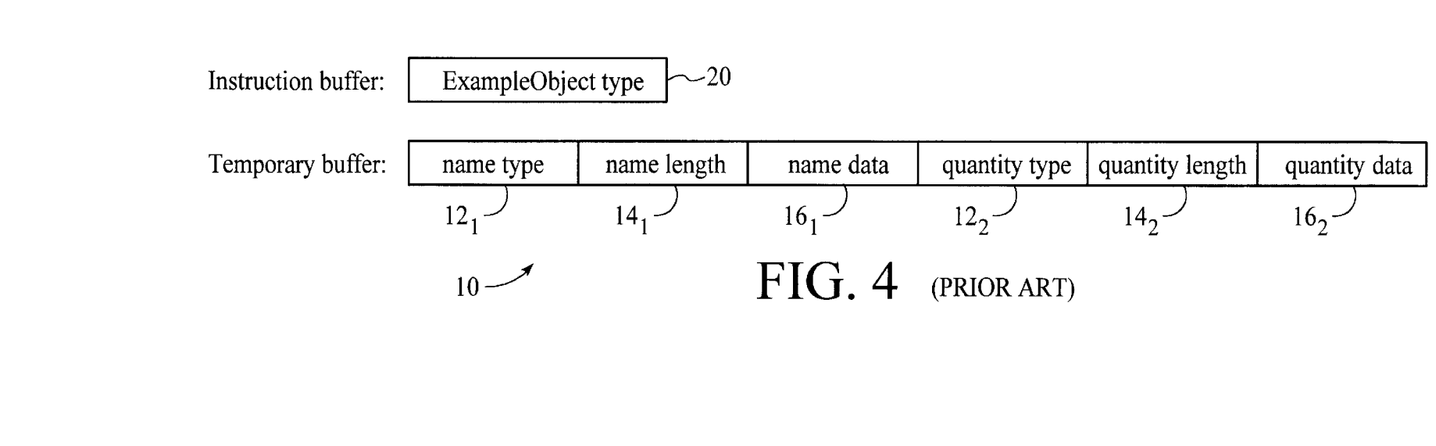
FIG. 4 illustrates ASN.1 encoding of ExampleObject message as an example of conventional ASN.1 encoding.

As an example of conventional ASN.1 encoding, FIG. 4 illustrates ASN.1 encoding of the ExampleObject element. Construction of the element ExampleObject cannot begin until the total length of the inner (nested) elements is obtained, from which the length of SEQUENCE can be derived. As noted hereinabove, traditionally, encoding such an element requires two memory buffers—a temporary buffer 10 for constructing the inner elements and a message buffer 20 for constructing the entire element ExampleObject, as illustrated in FIG. 4. The inner elements, name and quantity, whose data fields are name-data $16_1$ and quantity-data $16_2$, are first to be encoded. Once their length, name-length $14_1$ and quantity-length $14_2$, respectively, is obtained, name and quantity are copied to the message buffer 20 which contains the SEQUENCE header (type and length).

Figure 5:
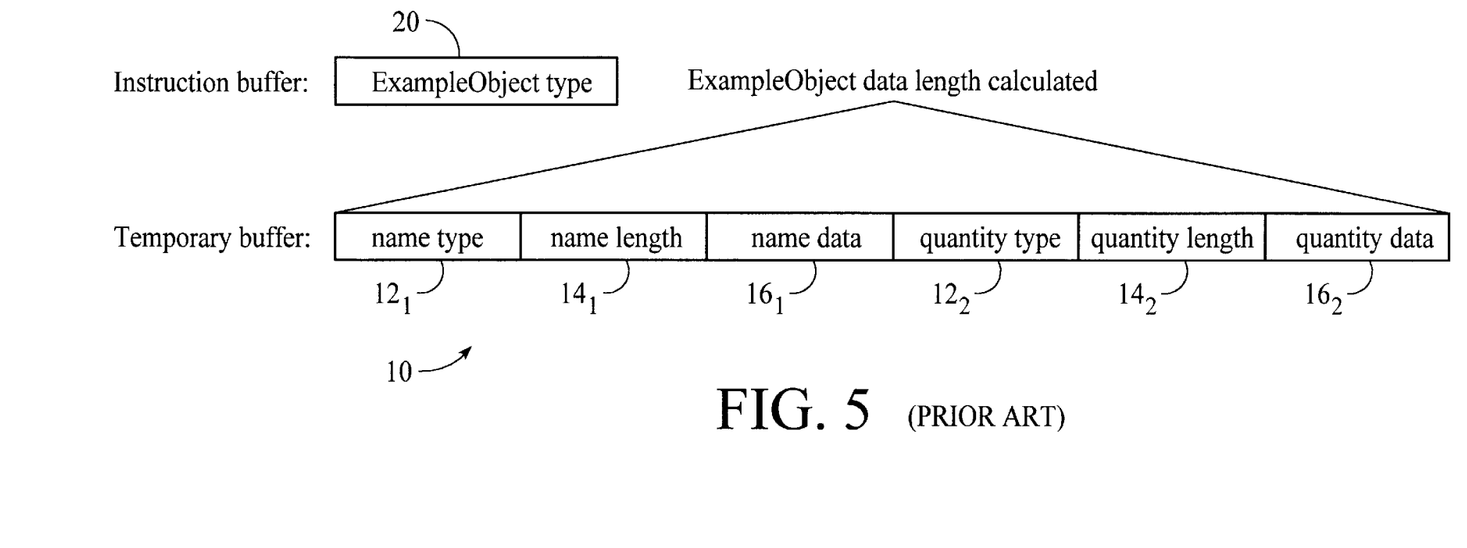
FIG. 5 illustrates a method of obtaining the length of the ExampleObject message.

FIG. 5 illustrates a method of obtaining the length of the ExampleObject element. The fields are similarly designated as in FIG. 4. Since, name and quantity comprise the data of ExampleObject, their combined length is the length of ExampleObject's data. Once the length of the element ExampleObject is obtained from the name-length $14_1$ and quantity-length $14_2$, a proper number of bytes for the data-length field can be allocated in the ExampleObject element buffer 20. Only then the construction of the ExampleObject element can continue in the element buffer 20 as hereafter described.

Figure 6:
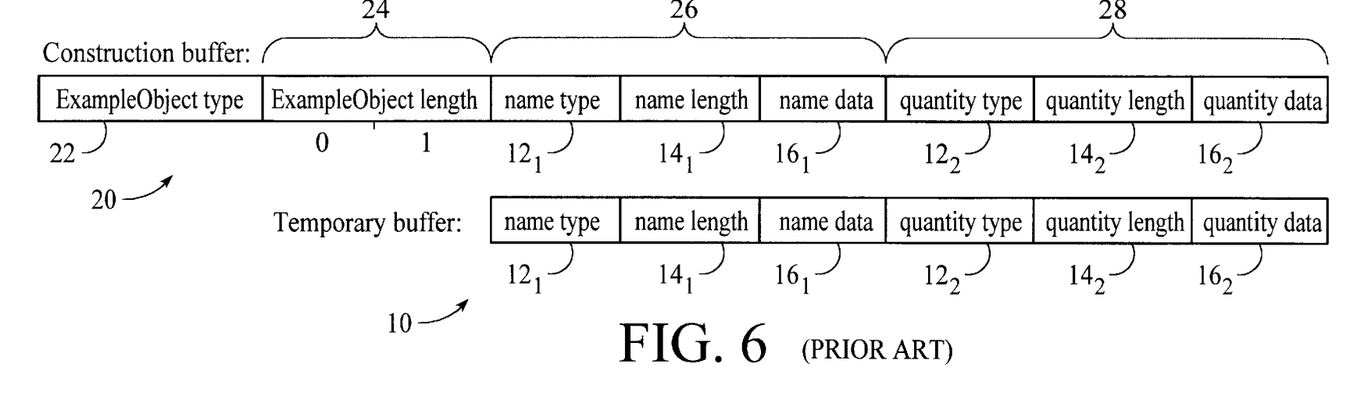
FIG. 6 illustrates a message buffer once the ExampleObject message is constructed with the contents of a temporary buffer.
Figure 7:
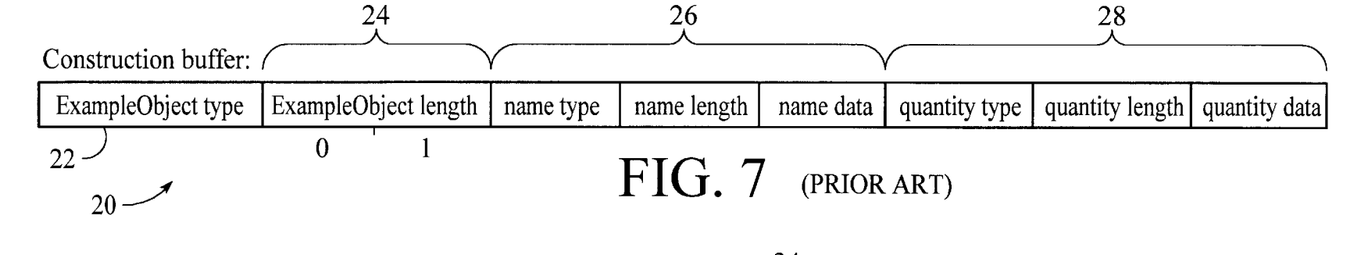
FIG. 7 illustrates the message buffer after the contents of the temporary buffer has been utilized and the temporary buffer is deleted or deallocated leaving only the message buffer.

FIG. 6 illustrates the element buffer once the ExampleObject element is constructed with the contents of the temporary buffer 10. Once the name-length $14_1$ and quantity-length $14_2$, respectively, have been obtained, the name and quantity elements are copied to the message buffer 20. Then the element buffer 20 includes the ExampleObject type field 22 followed by the 2-byte data-length field 24 which indicates the combined length of the name and quantity elements 26 and 28, respectively. After the contents of the temporary buffer 10 has been utilized, the temporary buffer 10 may be deleted or deallocated leaving only the element buffer 20 as illustrated in FIG. 7.

Hence, the foregoing conventional ASN.1 encoding consumes substantial computation time and system resources. Moreover, as the message becomes more complex, the encoding consumes time and resource more excessively. In contrast, the encoding in accordance with the present invention avoids unnecessary time and resources consumption.

Specifically, in the preferred embodiment, the length of electronic transaction elements (e.g. ExampleObject) is not evaluated until such elements have been first constructed. Instead of allocating a temporary buffer and a message buffer for constructing the entire, only one buffer is utilized. This buffer includes a plurality of bytes sufficient to accommodate the ExampleObject element data and a header of this message. For TLV encoding, the header includes an element type field and a data-length field.

Figure 8:
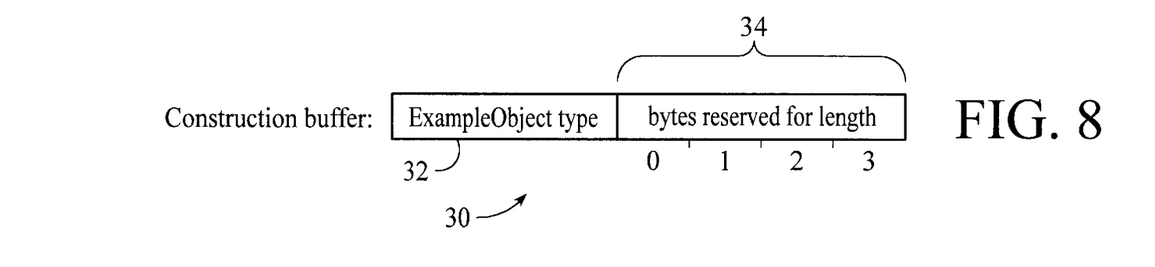
FIG. 8 illustrates the format of a message header of the ExampleObject message in accordance with the present invention.

FIG. 8 illustrates the format of an element header 30 of the element ExampleObject in accordance with the present invention. Assuming in this example that the maximum number of bytes for the data-length field is 4, a 4-bytes data-length field 34 is allocated following the ExampleObject type field 32. It should be understood that the maximum size of the data-length field can be set to any number of bytes without departing from the scope and novelty of the present invention.

Figure 9:
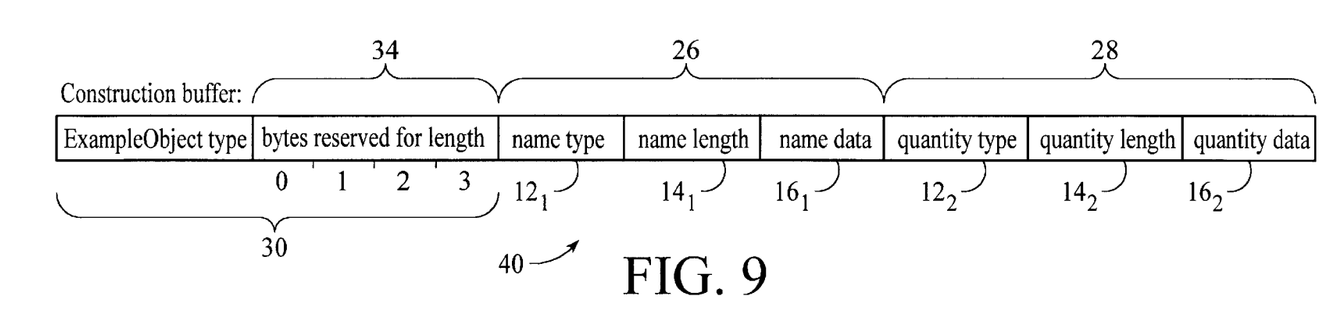
FIG. 9 illustrates the message buffer for constructing the ExampleObject message in accordance with the present invention.

FIG. 9 illustrates the buffer for constructing the ExampleObject element in accordance with the present invention. The buffer 40 includes the header 30 as illustrated in FIG. 8, including the ExampleObject type and the 4-bytes data-length field. Appended to (or proximate to) the header 30 in the message buffer 40 are the previously-mentioned name and quantity elements 26 and 28, respectively. As each of the name and quantity elements 26 and 28 are appended, their respective length, name-length $14_1$ and quantity-length $14_2$, are evaluated.

Figure 10:
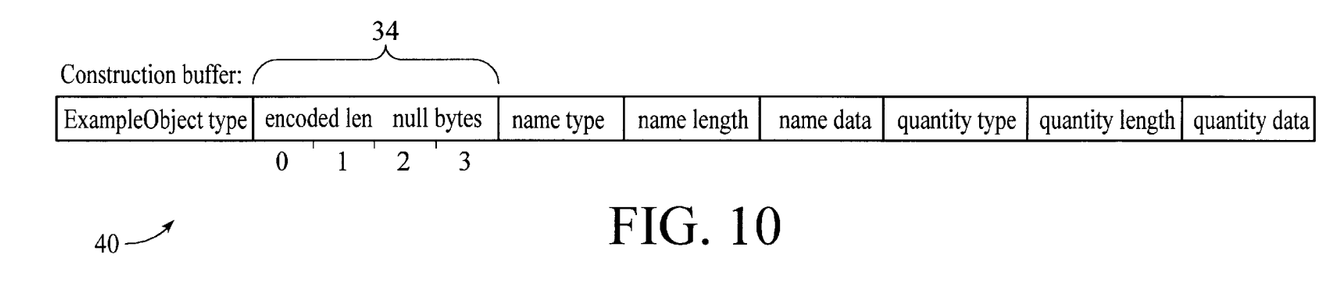
FIG. 10 illustrates a completed message construction when a total length value occupies an entire maximum number of bytes allocated for a data-length field.

Combined, the name-length 14₁ and quantity-length 14₂ provide the total length of the ExampleObject. This value is written to the data-length field 34 of the buffer 40. If the total length value occupies the entire maximum number of bytes allocated for the data-length field 34, then the element construction of ExampleObject is complete as illustrated in FIG. 10.

Figure 11:
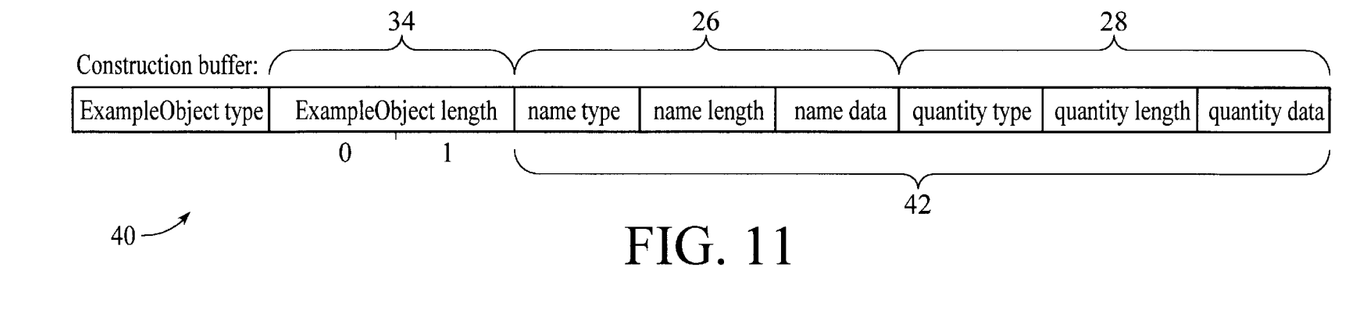
FIG. 11 illustrates the data-length field after a data shift when the total length value does not occupy the entire maximum number of bytes allocated for the data-length field.

Alternatively, if the total length value occupies less then this maximum number of bytes, the remaining bytes are 'null' bytes. However, the ASN.1 encoding rules require that there can be no null bytes in a length field. In accordance with the present invention, the 'null' bytes are eliminated by shifting to the left the element data 42, which in this example includes the name and quantity message objects 26 and 28. The elimination of the 'null' bytes is performed so that the data-length field 34 is shrunk, if necessary, to includes the least number of bytes sufficient to represent the total length of the ExampleObject element and no 'null' bytes. As illustrated in FIG. 11, after the data shift the data-length filed 34 includes 2 bytes instead of the maximum 4.

It should be understood that the foregoing principles apply to any message format suitable for TLV encoding. It should be further understood that other methods of eliminating the 'null' bytes, such as shift right etc., depending on the message buffer format, can be utilized without departing from the scope and spirit of the present invention, so long as the final data-length field contains the proper number of bytes and so long as the message buffer properly includes the header and the message data.

Figure 12:
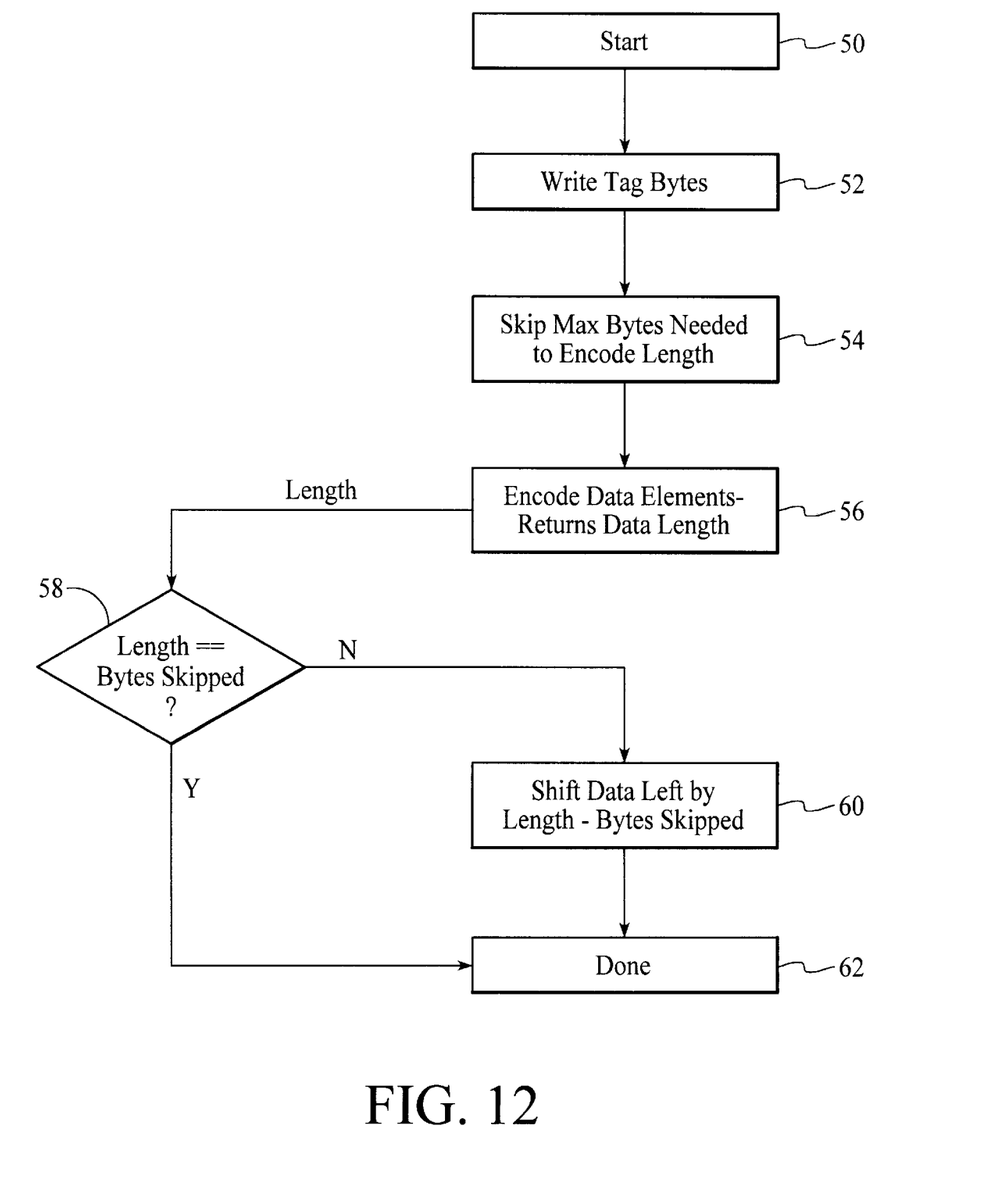
FIG. 12 is a flow diagram further illustrating the efficient message construction in accordance with the present invention.

The foregoing message encoding in accordance with the present invention is efficient because it utilizes the efficient message construction. FIG. 12 is a flow diagram further illustrating the efficient message construction in accordance with the present invention. The message construction begins by allocating a message buffer, via step 50. The message is tagged by writing the element tag (or type) byte(s) into the message type field, via step 52. Next, a predetermined maximum number of bytes is allocated in the buffer following the element type field for the data-length field, and this number of bytes is skipped pointing to a byte in the message buffer following the data-length field, via step 54. The element type field and the data-length field of the element together constitute the header of the element.

The process proceeds by traversing the element tree from its top. At each level of the element tree the element objects are encoded, wherein once the top level is exhausted the next lower level is accessed for encoding the next inner elements. This procedure continues until the lowest level is accessed for encoding the inner-most elements. Hence, each of the inner elements, if existing, are encoded and appended beginning in the element buffer following the header of the first element, via step 56. Also, once encoded, the respective length of each of the elements is evaluated and returned, via the step 56.

When the entire element tree has been traversed, the total length of the message data is derived. The number of bytes occupied by the total message length is determined and compared with the number of bytes allocated for the data-length field, via step 58. If the number of bytes are found to match, via step 58, than the message construction is complete and it ends, via step 62.

Alternatively, if the number of bytes are not found to match, via step 58, then the data-length field includes 'null' bytes which must be eliminated. In accordance with the present invention, the outer element data field (containing all the elements from the element tree) is shifted left by a number of bytes equal to the number of 'null' bytes in the data-length field, via step 60. As a result, the size of the data-length field is shrunk to include the least number of bytes necessary to represent the length of the message. Then the message construction ends, via step 62.

It follows that this technique does not require the use of additional temporary buffers duplicating the message in order to efficiently construct the message for encoding it. At most, the single buffer exceeds the message in length by only a few bytes. Hence, the saving of memory resources produced by the present invention is apparent. This saving of resources is even more apparent as the messages grow in complexity. Moreover, since only one pass through the element tree is needed in order to encode and append the inner message objects, processor cycles are saved as well. Finally, by reason of avoiding several iterations, the foregoing process is simpler. Hence, the present invention provides an easily implemented efficient message encoding.

As stated before, the foregoing principles apply to other technologies including encryption and gene sequencing which use TLV encoding of digital data in a data processing system. Therefore, the present invention provides, in general, efficient digital data encoding in a data processing system.

A method and system have been disclosed for efficient digital data encoding in a data processing system. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for efficient digital data encoding in a data processing system comprising the steps of:
   a) providing a buffer; and
   b) utilizing a forward looking encoding process including the sequential steps of:
      b1) allocating a maximum number of bytes for a maximum size data-length field within the buffer;
      b2) determining a data-length value for the digital data by encoding each of at least one portion of the digital data, the maximum size data-length field for receiving the data-length value; and
      b3) adjusting the maximum size data-length field, wherein the forward looking encoding process avoids a resources and time consuming duplication of the digital data.

2. The method of claim 1, wherein the encoding of each of the at least one portion of the digital data includes determining their respective lengths.

3. The method of claim 2, wherein the adjusting step b3) further includes the step of:
   b3a) eliminating any 'null' bytes from the maximum size data-length field when the data-length value does not occupy the maximum number of bytes in the maximum size data-length field so that the data-length field is shrunk to a least number of bytes sufficient to accommodate the data-length value.

4. The method of claim 3, wherein the method consumes an excess number of bytes which is equal to a number of the 'null' bytes.

5. The method of claim 3, wherein the eliminating step b3a) further includes the step of:
b3a1) shifting left the data.

6. A method for efficient digital data encoding in a data processing system comprising the steps of:
a) providing a buffer;
b) tagging the digital data in a first field of the buffer to identify the type of the digital data;
c) allocating a predetermined number of bytes in the buffer for a second field of the buffer, the second field for receiving a digital data length value;
d) determining the digital data length value based on the length of the digital data;
e) appending the digital data to a header in the buffer, the header including the first and second fields;
f) writing the digital data length value in the second field; and
g) shifting the digital data in the buffer to eliminate null bytes in the second field.

7. The method of claim 6, wherein the second field comprises a data-length field.

8. The method of claim 7, wherein the buffer comprises a plurality of memory bytes sufficient to accommodate the digital data and the header.

9. The method of claim 8, wherein the tagging step b) further includes the step of:
b1) writing the digital data type to the first field, the first field being a type field.

10. The method of claim 9, wherein the type field is located at the beginning of the buffer.

11. The method of claim 10, wherein the type field precedes the data-length field within the header.

12. The method of claim 11, wherein the predetermined number of allocated bytes is a maximum number of expected bytes for the data-length field.

13. The method of claim 12, wherein the maximum number of expected bytes is based on a largest expected digital data length value.

14. The method of claim 13, wherein the determining step c) further includes the steps of:
c1) encoding inner objects of the digital data for providing their length; and
c2) providing a sum of the lengths of the inner objects, the digital data length value comprising the sum.

15. The method of claim 14, wherein the appending step d) further includes the steps of:
d1) copying in order each of the inner objects to a location in the buffer following the header, the inner objects located starting with an upper level of a digital data tree of the digital data and ending with a lower-most level of the digital data tree.

16. The method of claim 15, wherein the inner objects comprise nested digital data objects.

17. The method of claim 16, wherein the shifting step f) further includes the steps of:
f1) determining if the digital data length value occupies all the predetermined number of allocated bytes;
f2) shifting the digital data so that the data-length field no longer includes null bytes.

18. The method of claim 17, wherein the digital data is shifted left by a number of bytes equal to the number of null bytes in the data-length field.

19. A method for efficient digital data encoding in a data processing system comprising the steps of:
a) providing a buffer having a plurality of fields, the plurality of fields including a type field for receiving a digital data type, a data-length field for receiving a digital data length value and a data field for receiving the digital data, the type field and the data-length field forming a header proximate to the data field;
b) tagging the digital data with the digital data type in the type field to identify the digital data;
c) allocating a predetermined number of bytes in the buffer for the data-length field based on a maximum length value of the digital data;
d) determining the digital data length value based on the length of the digital data;
e) copying the digital data to the data field;
f) writing the digital data length value in the data-length field; and
g) eliminating null bytes in the data-length field.

20. A data processing system for efficient digital data encoding comprising:
a memory including a buffer;
means communicating with the buffer for tagging the digital data to identify the type of the digital data;
means communicating with the buffer for allocating a predetermined number of bytes from the buffer for a data-length field, the data-length field for receiving a digital data length value;
means communicating with the buffer for appending the digital data to the data-length field;
means communicating with the appending means for determining the digital data length value based on the length of the digital data;
means communicating with the buffer and the determining means for writing the digital data length value in the data-length field; and
means communicating with the buffer for shifting the digital data in the buffer to eliminate null bytes in the data-length field.

21. The system of claim 20, wherein the buffer includes a plurality of bytes sufficient to accommodate the digital data and a header.

22. The system of claim 21, wherein the header comprises a type field for receiving the digital data type and the data-length field.

23. A computer readable medium including program instructions for efficient digital data encoding in a data processing system, the program instructions for:
a) providing a buffer;
b) tagging the digital data in a type field of the buffer to identify the type of the digital data;
c) allocating a predetermined number of bytes in the buffer for a data-length field of the buffer, the data-length field for receiving a digital data length value;
d) determining the digital data length value based on the length of the digital data;
e) appending the digital data proximate to a header in the buffer, the header including the type and data-length fields;
f) writing the digital data length value in the data-length field; and
g) shifting the digital data in the buffer to eliminate null bytes in the data-length field.

24. A method for efficient digital encoding in a data processing system comprising the steps of:
a) providing a buffer; and
b) utilizing a forward looking encoding process including the sequential steps of:

b1) allocating a maximum number of bytes for a maximum size data length field within the buffer;
b2) determining a data-length value for the digital data by encoding each of at least one portion of the digital data, the maximum size data-length field for receiving the data-length value, wherein the encoding of each of the at least one portion of the digital data includes determining their respective lengths;
b3) adjusting the maximum size data-length field, wherein the forward looking encoding process avoids a resources and time consuming duplication of the digital data; and
b3a) eliminating any 'null' bytes from the maximum size data-length field when the data-length value does not occupy the maximum number of bytes in the maximum size data-length field so that the data-length field is shrunk to a least number of bytes sufficient to accommodate the data-length value.

25. A method for efficient digital data encoding in a data processing system comprising the steps of:
a) providing a buffer; and
b) utilizing a forward looking encoding process including the sequential steps of:
b1) allocating a maximum number of bytes for a maximum size data length field within the buffer;
b2) determining a data-length value for the digital data by encoding each of at least one portion of the digital data, the maximum size data-length field for receiving the data-length value, wherein the encoding of each of the at least one portion of the digital data includes determining their respective lengths;
b3) adjusting the maximum size data-length field, wherein the forward looking encoding process avoids a resources and time consuming duplication of the digital data; and
b3a) eliminating any 'null' bytes from the maximum size data-length field when the data-length value does not occupy the maximum number of bytes in the maximum size data-length field so that the data-length field is shrunk to a least number of bytes sufficient to accommodate the data-length value, wherein the method consumes an excess number of bytes which is equal to a number of the 'null' bytes.

26. A method for efficient digital data encoding in a data processing system comprising the steps of:
a) providing a buffer; and
b) utilizing a forward looking encoding process including the sequential steps of:
b1) allocating a maximum number of bytes for a maximum size data length field within the buffer;
b2) determining a data-length value for the digital data by encoding each of at least one portion of the digital data, the maximum size data-length field for receiving the data-length value, wherein the encoding of each of the at least one portion of the digital data includes determining their respective lengths;
b3) adjusting the maximum size data-length field, wherein the forward looking encoding process avoids a resources and time consuming duplication of the digital data;
b3a) eliminating any 'null' bytes from the maximum size data-length field when the data-length value does not occupy the maximum number of bytes in the maximum size data-length field so that the data-length field is shrunk to a least number of bytes sufficient to accommodate the data-length value; and
b3a1) shifting left the data.

\* \* \* \* \*